United States Patent [19]

Ainsworth et al.

[11] Patent Number: 4,705,961
[45] Date of Patent: Nov. 10, 1987

[54] PROGRAMMABLE SWEEP GENERATOR

[75] Inventors: Walter W. Ainsworth, Beaverton; Arthur J. Metz, Gervais, both of Oreg.

[73] Assignee: Tektronix, Inc., Beaverton, Oreg.

[21] Appl. No.: 820,590

[22] Filed: Jan. 21, 1986

Related U.S. Application Data

[63] Continuation of Ser. No. 458,239, Jan. 17, 1983, abandoned.

[51] Int. Cl.[4] .................. H03K 4/08; H03K 4/84
[52] U.S. Cl. .................. 307/228; 307/246; 307/263; 328/127; 328/181
[58] Field of Search .................. 328/127, 181, 35; 307/227, 246, 228, 260, 261, 268, 296 A, 297, 263

[56] References Cited

U.S. PATENT DOCUMENTS

| | | | |
|---|---|---|---|
| 3,814,352 | 6/1974 | Grimes | 307/228 |
| 3,839,679 | 10/1974 | Hughes | 307/228 |
| 3,875,427 | 4/1975 | Riley | 307/228 |
| 3,889,198 | 6/1975 | Lighthall et al. | 307/228 |
| 4,001,698 | 1/1977 | Alfred | 328/127 |
| 4,016,496 | 4/1977 | Eastcott | 328/127 |
| 4,029,972 | 6/1977 | Fox et al. | 307/228 |
| 4,088,906 | 5/1978 | Hüllwegen | 328/127 |
| 4,224,573 | 9/1980 | Brook | 328/127 |
| 4,228,366 | 10/1980 | Hüttemann et al. | 328/127 |
| 4,359,649 | 11/1982 | Mündel | 307/228 |
| 4,443,713 | 4/1984 | Layton | 307/228 |
| 4,458,200 | 7/1984 | Geller | 307/297 |

OTHER PUBLICATIONS

IC Schematic Sourcemaster, J. Wiley & Sons, New York, 1978, p. 160.

Primary Examiner—Stanley D. Miller
Assistant Examiner—Timothy P. Callahan
Attorney, Agent, or Firm—George T. Noe

[57] ABSTRACT

A programmable sweep generator for generating a linear ramp signal of different slopes in a predetermined step sequence is disclosed. The programmable sweep generator comprises a controllable voltage generator, a voltage-to-current converter, and integrator sections. The slopes of the ramp signal may be electronically controlled by switching the controllable voltage generator, voltage-to-current converter and timing capacitors in the integrator section. The use of independent buffer amplifiers, independent control circuits, and current steering devices for each timing capacitor eliminates the need to connect a switching element in series with each timing capacitor, thereby eliminating any error or non-linearity.

9 Claims, 8 Drawing Figures

PROGRAMMABLE SWEEP GENERATOR

This is a continuation of application Ser. No. 458,239 filed Jan. 17, 1983 and now abandoned.

BACKGROUND OF THE INVENTION

The present invention relates generally to programmable sweep generators, and more particularly to a sweep generator for generating a sweep signal, the slope or sweep rate of which may be switched in predetermined steps.

Sweep (or ramp) generators are widely used in electronic instrumentation, one example of which is in an oscilloscope, wherein accurate sweep signals are generated in predetermined steps to provide the timebase of a quantitative waveform measurement. Sweep generators for typical oscilloscopes generate timebase sweep signals ranging from ten nanoseconds per screen division to five seconds per screen division in 1-2-5 steps.

Shown in FIG. 1 is a conventional sweep generator which comprises a controllable current source including transistor $Q_1$, a plurality of timing resistors $R_1, R_2, \ldots, R_n$, switches $S_{21}, S_{22}, \ldots, S_{2n}$, an operational amplifier OP, a plurality of timing capacitors $C_1, \ldots, C_m$, switched by respective switches $S_1, \ldots, S_{1m}$, a gating transistor $Q_2$ and a buffer amplifier A. A reference voltage $V_{ref}$ is applied to the non-inverting input of operational amplifier OP to maintain the emitter potential of transistor $Q_1$ equal to $V_{ref}$ regardless of the output current from the controllable current source, the collector current of transistor $Q_1$, therefore depending only on the selected timing resistor $R_1, R_2, \ldots,$ or $R_n$. Such output current is commonly referred to as a timing current and is utilized to charge the selected timing capacitor $C_1, \ldots,$ or $C_m$ while gating transistor $Q_2$ remains non-conducting, thereby developing a linear ramp voltage across the timing capacitor to be made available via buffer amplifier A to output terminal OUT. The sweep rate is proportional to the timing current but inversely proportional to the capacitance of timing capacitor. Gating transistor $Q_2$ is turned on by applying a relatively positive voltage to the base thereof to discharge the timing capacitors $C_1, \ldots, C_m$, thereby forming a short retrace portion of the ramp signal. Buffer amplifier A may include a source follower field effect transistor (FET) input stage and an emitter follower output stage for impedance conversion, thereby minimizing changes in the timing current due to leakage (or bias current), which may cause timing error.

Disadvantages of the conventional sweep generator include the need for many precision timing elements (capacitors and resistors) including timing resistors in the order of ten kilohms to over ten megohms and difficulty in implementing electronic switches. For example, any resistance of the switches S, in series with the timing capacitor would develop an undesirable voltage step when the timing current is supplied thereto. Such a voltage step is not negligible as the timing current becomes larger.

SUMMARY OF THE INVENTION

A programmable sweep generator according to the present invention utilizes a current source, a current-to-voltage converter, a voltage-to-current converter and a timing capacitor. The first two elements may be used to develop controllable voltages, for example, under control of a microprocessor ($\mu$P), thereby providing the sub-decimal switching of the sweep rate (e.g. 1, 2 and 5). The voltage-to-current converter may be used to switch the sweep rate in decimal fashion (e.g. 1, 10, 100, etc). Switches in series with the timing capacitor are eliminated thereby avoiding any voltage step or non-linearity in the output sweep voltage due to switching to the selected timing capacitor. The present invention may be applied to a type of sweep generator in which a current is switched into a capacitor as well as a Miller integrator type.

It is therefore an object of the present invention to provide a programmable sweep generator particularly suited for integrated circuit design.

It is another object of the present invention to provide a programmable sweep generator for an oscilloscope.

It is still another object of the present invention to provide an improved programmable sweep generator well suited for $\mu$P control application.

These and other objects, advantages, and features of the present invention will be apparent from the following detailed description and attached drawings.

BRIEF DESCRIPTION OF THE DRAWINGS

FIG. 8 is a circuit schematic of a buffer amplifier for sweep signal output.

DETAILED DESCRIPTION OF THE INVENTION

Figure 1:
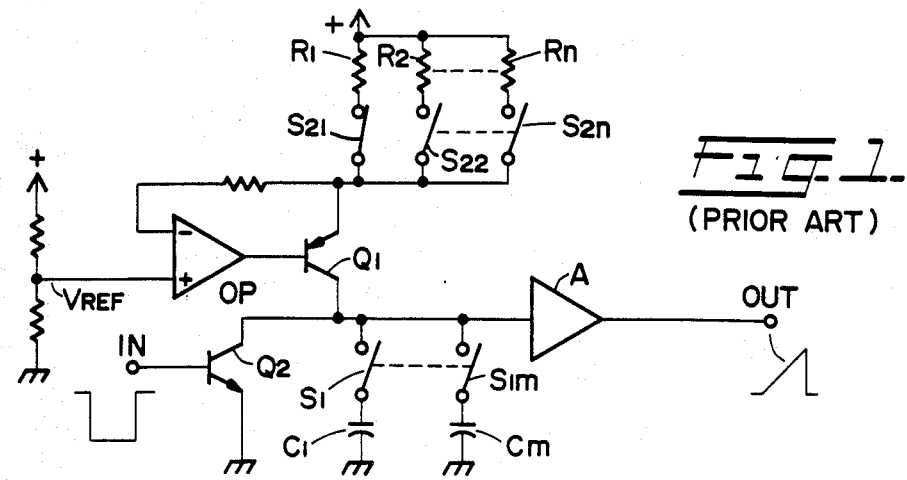
FIG. 1 is a circuit schematic of a conventional sweep generator.
Figure 2:
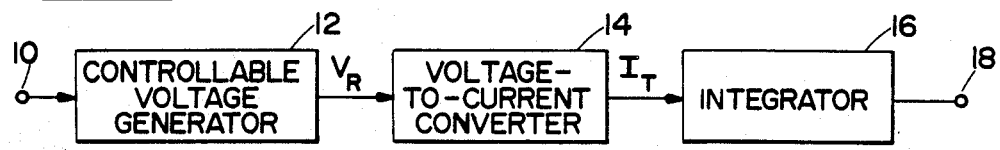
FIG. 2 is a simplified block diagram of a programmable sweep generator according to the present invention.

Referring now to FIG. 2 illustrating the present invention in a simplified block diagram, the programmable sweep generator according to the present invention comprises three blocks: controllable voltage generator 12 to generate a plurality of output voltages $V_R$ under control of an input signal applied to input terminal 10, voltage-to-current converter 14 for converting the $V_R$ into the corresponding timing currents $I_T$, and integrator 16 integrating the current $I_T$ to develop an output sweep voltage to be available from output terminal 18 by way of a buffer amplifier as necessary.

Controllable voltage generator 12 may include a controllable current source, which may be operable under control of a $\mu$P, and a current-to-voltage converter. The output voltage $V_R$ may suitably be in the range of 20 to 25 volts. Voltage-to-current converter 14 may include a plurality of resistors to generate a timing current of desired magnitude. Switching of such resistors may be performed by using electronic switches to facilitate control by a $\mu$P or any other digital control device. Integrator 16 may include a plurality of switchable timing capacitors. Although not shown in FIG. 2, a control signal or a sweep gate signal may be applied to integrator 16 for repetitive generation of the sweep signal by charging and discharging such timing capacitors.

Figure 3:
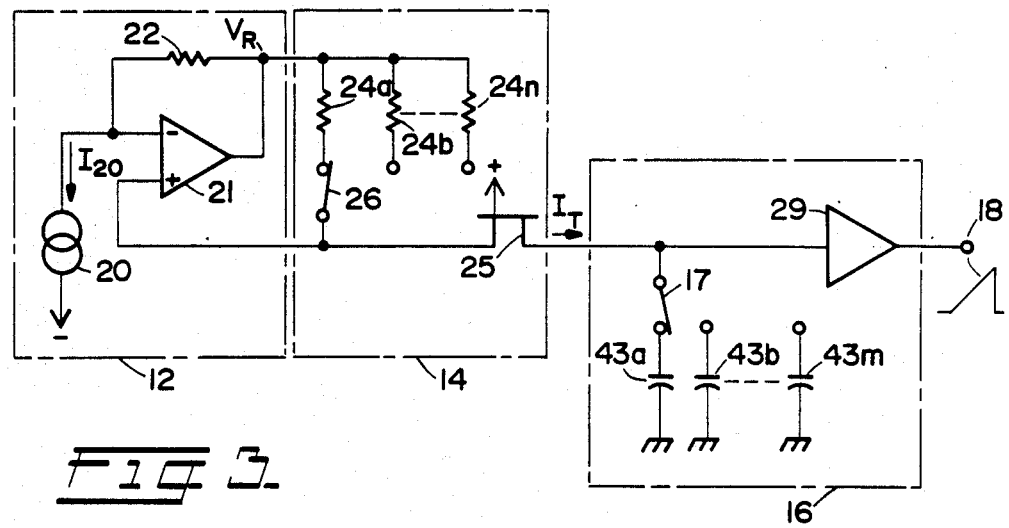
FIG. 3 is a simplified circuit schematic of a programmable sweep generator to which the present invention is applied.

The present invention will best be understood by reference to a plurality of practical embodiments illustrated as a whole or in part in FIGS. 3 through 8. Shown in FIG. 3 is a circuit schematic of one preferred embodiment of the programmable sweep generator. Controllable voltage generator 12 comprises in this particular embodiment operational amplifier 21, current source 20 coupled to the inverting input of operational amplifier 21 and resistor 22 connected between the inverting input and the output terminals of operational amplifier 21. It is understood that the output voltage $V_R = I_{20} \times R_{22}$, where $I_{20}$ and $R_{22}$ represent respectively the output current from current source 20 and the resistance of feedback resistor 22. The $V_R$ is therefore controllable by varying either one or both of the values of $I_{20}$ and $R_{22}$. For precise control of voltage $V_R$, however, the current $I_{20}$ is normally controlled by utilizing, for example, a digital-to-analog converter (DAC) to receive a digital signal from a computer or similar control means.

The output voltage $V_R$ is then forced by operational amplifier 21 across a selected one of resistors $24_a$, $24_b$, ..., $24_n$ selected by switch 26 constituting voltage to current converter 14 along with FET 25, which may be replaced by a PNP transistor. Because of very high input impedance of operational amplifier 21, such as, for example, the one including an FET input stage, the current $I_{20}$ flows through feedback resistor 22. Similarly, the resulting current flowing through the selected resistor 24, which is substantially equal to $V_R/R_{24}$, flows only through the source-drain (or emitter-collector) path of transistor 25. The non-inverting input of operational amplifier 21 is maintained at a desired voltage by transistor 25 along with the gate (or base) bias network.

Integrator section 16 receiving the drain output current (timing current $I_T$) comprises a plurality of switchable capacitors $43_a$, $43_b$, ..., $43_m$ selected by switch 17 and buffer amplifier 29, which may include an FET input stage. It is understood that the timing current $I_T$ is directly proportional to the current $I_{20}$ (or the voltage $V_R$) and inversely proportional to resistance $R_{24}$ (the resistance of selected resistor $24_a$, $24_b$, ..., $24_n$). The sweep rate (slope) of the sweep signal is directly proportional to the current $I_T$ and inversely proportional to the capacitance of the selected timing capacitor 43. The sweep rates of the resulting sweep signal may be programmed over a wide range by proper control of current source 20, and switches 26 and 17. Timing current $I_T$ may be varied, for example, from ten microamperes to five milliamperes in 1-2-5 step sequence without using very large timing resistors.

Figures 4, 5:
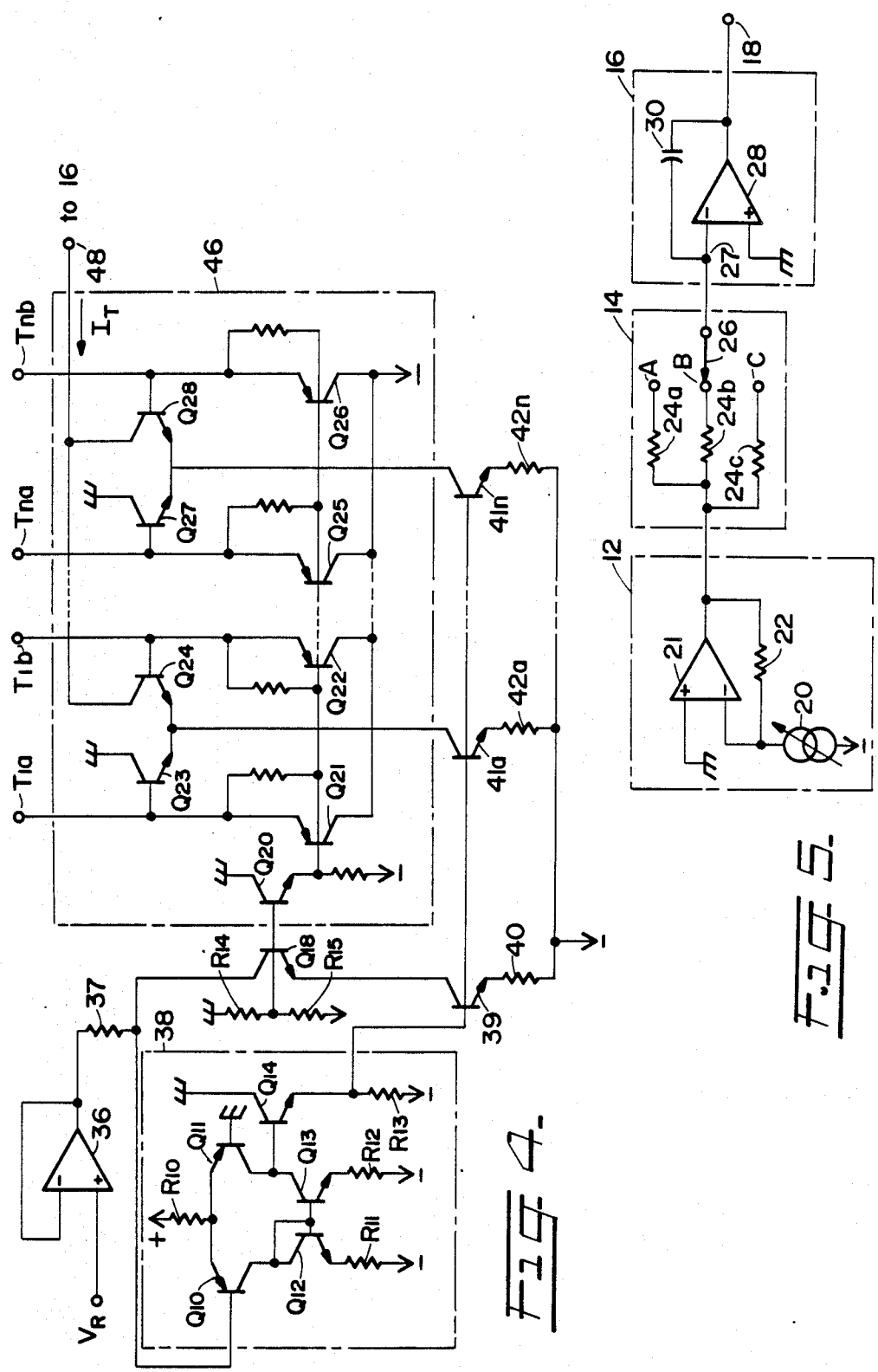
FIG. 4 is a circuit schematic of another embodiment of the programmable sweep generator according to the present invention.
FIG. 5 is a simplified circuit schematic of still another embodiment of the present invention.

Shown in FIG. 4 is a circuit schematic of another embodiment of the sweep generator according to the present invention. Controllable voltage generator section for generating the voltage $V_R$ is not included in FIG. 4 for simplicity. The voltage $V_R$ generated by any desired generator similar to the one in FIG. 3 or described hereinafter is first applied to one end of input resistor 37 by way of buffer amplifier 36. The other end of input resistor 37 is applied to the non-inverting input of operational amplifier 38 comprising transistors $Q_{10}$ and through $Q_{14}$, and resistors $R_{10}$ through $R_{13}$. Transistors $Q_{10}$ and $Q_{11}$ comprise an emitter coupled transistor pair with the base of transistor $Q_{11}$, the inverting input, referenced to ground. Transistors $Q_{12}$ and $Q_{13}$ form a current mirror circuit. The collector of transistor $Q_{11}$ is coupled to the base of transistor $Q_{14}$, providing an emitter follower amplifier. The emitter output of transistor $Q_{14}$ is applied to the base of transistor 39, the collector of which is fed back to the non-inverting input of operational amplifier 38 by way of the common base transistor $Q_{18}$. A reference voltage provided by resistive divider comprising resistors $R_{14}$ and $R_{15}$ is applied to the base of transistor $Q_{18}$. The emitter of transistor 39 is returned to a negative voltage source through resistor 40.

A plurality of current source transistors $41_a$, ..., $41_n$ including respective programmed emitter resistors $42_a$, ..., $42_n$ are connected in parallel with transistor 39. Connected to the collectors of transistors $41_a$, ..., $41_n$ is a switching circuit 46 to provide a controllable timing current $I_T$ to integrator 16 through output terminal 48 under control of a logic control signal applied to control terminals $T_{1a}$, $T_{1b}$, ..., $T_{na}$, $T_{nb}$. The collector of transistor $41_a$ is coupled to the common emitter junction of emitter coupled transistor pair $Q_{23}$-$Q_{24}$. Similarly, the collector of transistor $41_n$ is coupled to the emitter junction of emitter coupled transistor $Q_{27}$-$Q_{28}$. Voltage swing on the bases of transistors $Q_{23}$, $Q_{24}$, $Q_{27}$ and $Q_{28}$ is determined by respective transistors $Q_{21}$, $Q_{22}$, $Q_{25}$ and $Q_{26}$, the bases of which are coupled to the base of transistor $Q_{18}$ by way of emitter follower transistor $Q_{20}$ for buffer and temperature compensation purposes. Coupled to the bases of transistors $Q_{23}$, $Q_{24}$, $Q_{27}$ and $Q_{28}$ are control terminals $T_{1a}$, $T_{1b}$, ..., $T_{na}$ and $T_{nb}$. One collector output of each emitter coupled transtor pair $Q_{23}$-$Q_{24}$, ..., $Q_{27}$-$Q_{28}$ is grounded but the other collector outputs are coupled in common to output terminal 48.

In operation, operational amplifier 38 amplifies the input signal thereto in such a manner that the entire current ($V_R/R_{37}$) flows from collector to emitter through transistor $Q_{18}$ and then to the emitter of transistor 39, thereby setting the base voltage of transistors 39, $41_a$, ..., $41_n$ substantially equal to $$\frac{R_{40}}{R_{37}} V_R.$$

The collector current of the transistor $41a$ is substantially equal to $$\frac{R_{40}}{R_{37}R_{42a}} V_R.$$

Similarly, the collector current of transistor $41_n$ is substantially equal to $$\frac{R_{40}}{R_{37}R_{42N}} V_R.$$

This suggests that the collector current of transistor $41_a$, ..., $41_n$ is inversely proportional to the respective emitter resistor $42_a$, ..., $42_n$. Such collector current is routed to output terminal 48 when a relatively high control voltage is applied to control terminals $T_{1b}$, $T_{2b}$, ..., $T_{nb}$, but bypassed to ground when a relatively high control voltage is applied to the other control terminals $T_{1a}$, $T_{2a}$, ..., $T_{na}$. Such selected timing current $I_T$ is supplied to integrator 16 to charge timing capacitor, thereby developing a linear ramp signal thereacross.

As is understood from the foregoing description, controllable voltage $V_R$, resistance of resistors $42_a$, ..., $42_n$ are controlled so as to provide the programmable sweep voltage. Such selection may be made by controlling the digital signal applied to control terminals $T_{1a}$, $T_{1b}$, ... $T_{na}$, $T_{nb}$ in addition to the input signal to control voltage generator 12. The resistance of resistor 37 may also be switched as necessary. Note that the above-described programmable current source may be made as current source 20 in FIG. 3.

FIG. 5 is a circuit schematic of an alternative embodiment of a sweep generator similar to that of FIG. 3 wherein the integrator 16 of FIG. 3 is implemented with a Miller integrator comprising a buffer amplifier 28 and a capacitor 30 connected between an output terminal 18 and an inverting input terminal 27 of the amplifier 28. A noninverting terminal of amplifier 28 is grounded. In place of the converter 14 of FIG. 3, voltage to current conversion is accomplished simply by switch 26 selecting one of the series resistors 24.

Figure 6:
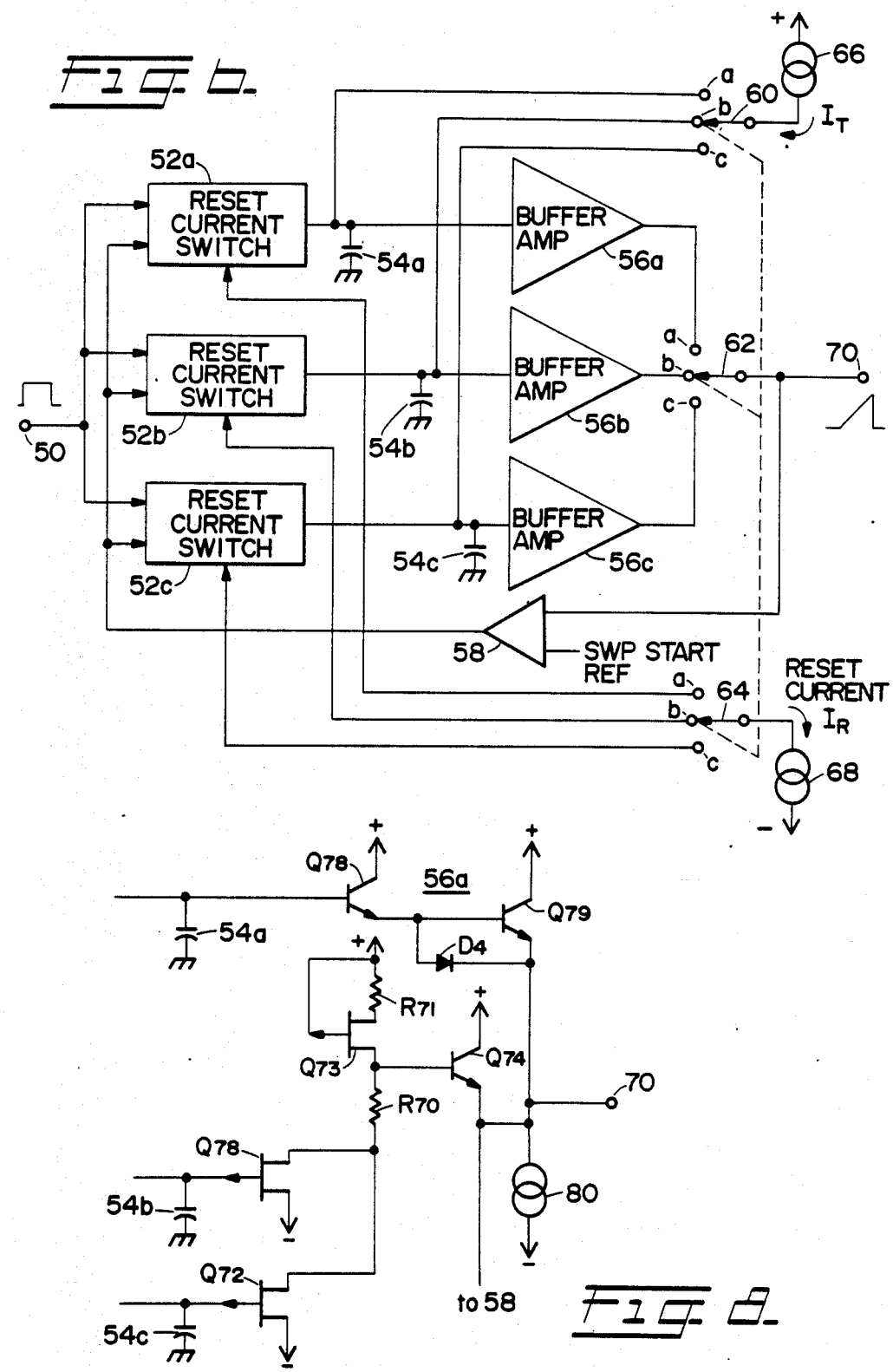
FIG. 6 is a block diagram of a sweep generator circuit according to the present invention.

FIG. 6 shows a simplified block diagram of a programmable sweep generator according to the present invention. This is particularly suited for switching one timing capacitor of a plurality of timing capacitors by electronic switching means. Applied to terminal 50 is a sweep gate pulse to control the generation of termination of the sweep signal. In this particular embodiment, three independent timing capacitors $54_a$, $54_b$, and $54_c$ and respective control circuits are used. Three reset current switch and disconnect diode circuits $52_a$, $52_b$, and $52_c$ receive the sweep gate signal applied to control terminal 50, reset current $I_R$ from reset current source 68 by way of switch 64, and the output from sweep start regulator 58. A timing current $I_T$ from current source 66 which may include a controllable voltage generator and a voltage-to-current converter as in FIG. 2, is supplied to timing capacitor $54_a$, $54_b$, or $54_c$ selectively through switch 60. The sweep voltage across each timing capacitor $54_a$ through $54_c$ is respectively coupled to output terminal 70 by way of respective buffer amplifier $56_a$ through $56_c$ and switch 62. Switches 60, 62 and 64 are intercoupled to operate simultaneously to select one of timing capacitors $54_a$, $54_b$, and $54_c$. The output voltage on output terminal 70 is applied to one input of comparator or sweep start regulator 58 which compares the quiescent output voltage with a sweep start reference level applied to the other input of such regulator 58. It is to be understood that while three timing capacitors are shown for this embodiment, the system may be expanded to include any desired number of timing capacitors.

In operation, all of the switches 60, 62, and 64 are set to the upper position "a" to select the first timing capacitor $54_a$. During the sweep period of the sweep gate signal applied to control terminal 50, the timing current $I_T$ is routed into timing capacitor $54_a$, thereby developing a ramp voltage thereacross. Such ramp voltage is supplied to output terminal 70 through buffer amplifier $56_a$ and switch 62. Similarly, the second or third timing capacitor $54_b$ or $54_c$ is chosen by setting switches 60, 62 and 64 to the middle position "b" or the lower position "c". When the sweep period is terminated, respective reset current switch and disconnect diode $52_a$, $52_b$ or $52_c$ is activated to discharge the respective timing capacitor, thereby forming the retrace portion of the ramp signal. Reset current $I_R$ is always larger than timing current $I_T$. Sweep start regulator 58 is used to establish a constant sweep start level by forming a closed loop circuit including the selected timing capacitor 54 and its associated circuits 52 and 56.

This circuit arrangement is particularly useful to avoid any error or voltage step mentioned earlier due to the residual resistance or reactance of the switch connected in series with such timing capacitor. In addition, no stray capacitance of an "off" switching device is added to the timing capacitor, thereby avoiding any timing error. It should be noted that buffer amplifier 56 is directly coupled across the respective timing capacitor because of the use of independent buffer amplifier and control circuit. As is described hereinafter, optimum buffer circuit may be used as each buffer amplifier $56_a$, $56_b$, or $56_c$.

Figure 7:
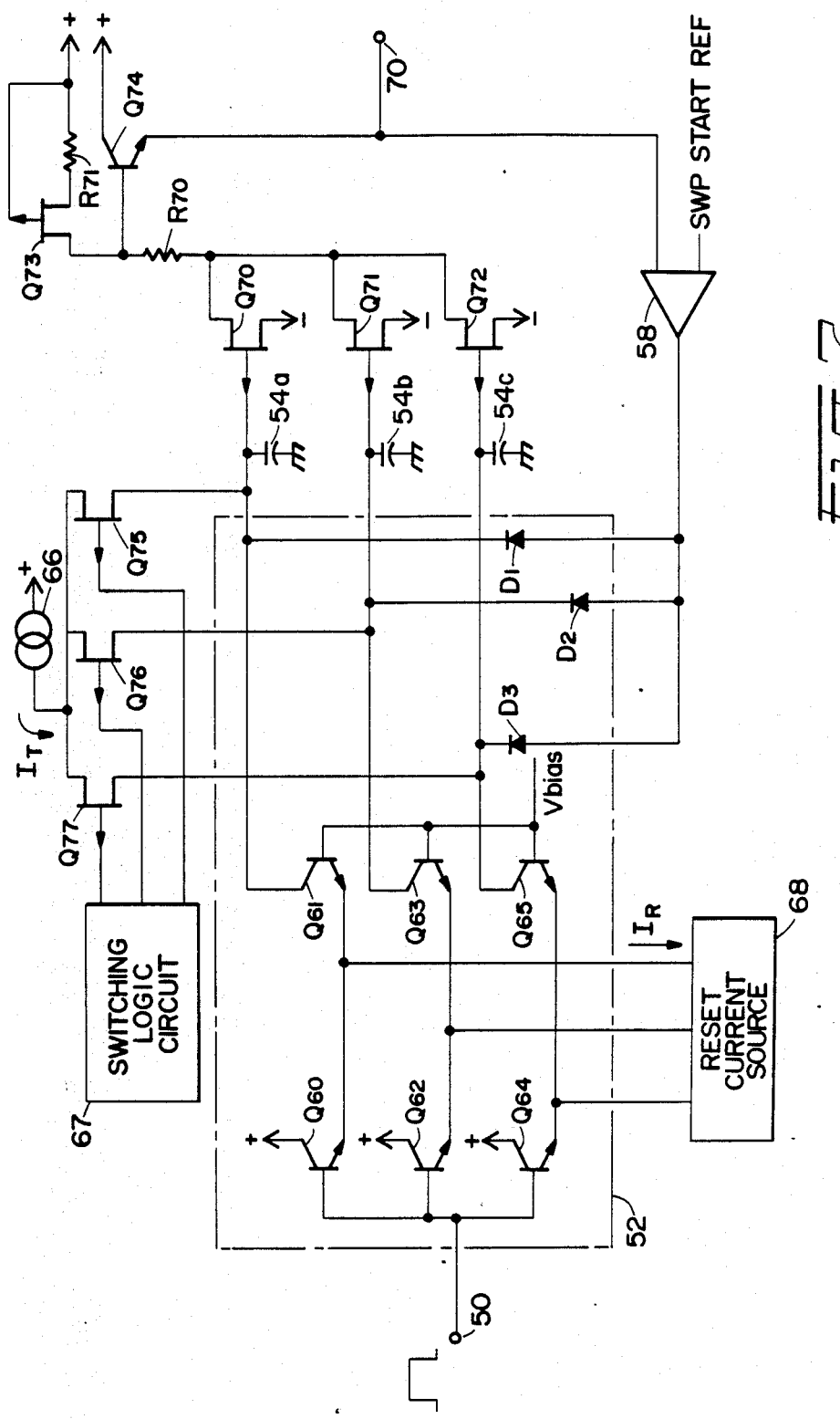
FIG. 7 is a circuit schematic of an integrator associated with FIG. 6.

The integrator block of FIG. 5 will better be understood by reference of FIG. 7 illustrating a circuit schematic of one practical embodiment. Reset current switch and disconnect diode circuit 52 comprises three emitter coupled transistor pairs $Q_{60}$-$Q_{61}$, $Q_{62}$-$Q_{63}$ and $Q_{64}$-$Q_{65}$ and three diodes $D_1$, $D_2$ and $D_3$. The bases of transistors $Q_{60}$, $Q_{62}$ and $Q_{64}$ are connected in common to control terminal 50 while the bases of transistors $Q_{61}$, $Q_{63}$ and $Q_{65}$ are connected to a suitable bias voltage source $V_{bias}$. The emitter node of each transistor pair is connected to reset current source 68. The collectors of transistors $Q_{60}$, $Q_{62}$ and $Q_{64}$ are connected to a positive voltage source while the collectors of transistors $Q_{61}$, $Q_{63}$ and $Q_{65}$ are respectively connected to timing capacitors $54_a$, $54_b$ and $54_c$. Anodes of three diodes $D_1$, $D_2$ and $D_3$ are coupled in common to the output of sweep start regulator 58 while the cathodes of such diodes are coupled respectively to timing capacitors $54_a$, $54_b$ and $54_c$.

Timing current source 66 is selectively coupled to timing capacitor $54_a$, $54_b$ or $54_c$ by way of respective current-steering FETs $Q_{75}$, $Q_{76}$ or $Q_{77}$ which are under control of switching logic circuit 67. Although not shown in FIG. 7, similar switching devices and a control logic circuit are included in reset current source 68.

Buffer amplifiers 56 comprise three FETs $Q_{70}$, $Q_{71}$ and $Q_{72}$, current source FET $Q_{73}$, resistors $R_{70}$ and $R_{71}$ and emitter follower output transistor $Q_{74}$. The gates of FETs $Q_{70}$, $Q_{76}$, and $Q_{72}$ are coupled to respective timing capacitors $54_a$, $54_b$, and $54_c$. The sources of FETs $Q_{70}$ through $Q_{72}$ are connected together to the lower end of resistor $R_{70}$, the upper end of which is connected to the base of transistor $Q_{74}$. The emitter of transistor $Q_{74}$ is connected to sweep start regulator 58 and defines output terminal 70 from which a linear ramp signal is produced. The outputs of the three buffer amplifiers are directly coupled and no selection switch representing switch 62 in FIG. 6 is employed in this particular embodiment.

In operation, assuming now that first timing capacitor $54_a$ is to be selected, logic control circuit 67 provides a low level only to the gate of FET $Q_{75}$ to steer all of timing current $I_T$ to the selected timing capacitor. Simultaneously, reset current source 68 is controlled to supply the reset current $I_R$ to the emitter node of first transistor pair $Q_{60}$-$Q_{61}$. As mentioned above, reset current $I_R$ is selected to be always larger than timing current $I_T$. During the retrace or quiescent condition of the sweep gate signal applied to control terminal 50, the base of transistor $Q_{60}$ is lower than $V_{bias}$, thereby making $Q_{61}$ conductive. Timing current $I_T$ from FET $Q_{75}$ and discharge current of timing capacitor $54_a$ flow through such transistor $Q_{61}$ during retrace. In the quiescent condition, timing capacitor $54_a$ is completely discharged, and the difference current equal to ($I_R$-$I_T$) is supplied from start level regulator 58 through diode $D_1$, thereby completing the closed loop to maintain the sweep start level equal to the reference level (e.g., ground level) applied to sweep start regulator 58. Degeneration resistor $R_{71}$ helps determine the drain current of $Q_{73}$ operating as a current source. Resistor $R_{70}$ is used for proper DC offset.

A linear ramp (or sweep) voltage starts from the aforementioned reference level when the sweep gate voltage at control terminal 50 goes high, thereby turning transistor $Q_{61}$ off the transistor $Q_{60}$ on, shifting reset current $I_R$ to a power supply. The selected timing capacitor $54_a$ is now charged by the timing current $I_T$ at the rate proportional to the $I_T$ but inversely proportional to the capacitance of such timing capacitor. As the ramp voltage develops across such timing capacitor, diode $D_1$ is automatically disconnected. The ramp voltage is then transmitted to output terminal 70 through FET $Q_{70}$, resistor $R_{70}$, and emitter-follower transistor $Q_{74}$. A reset circuit (not shown) is normally utilized to reset the sweep gate pulse when the ramp voltage reaches a predetermined level, thereby starting the retrace portion of the sweep signal. The above operation may be repeated by controlling the sweep gate signal applied to control terminal 50. It should be pointed out that a logic circuit or other mechanism (also not shown) holds the gate of FETs $Q_{71}$ and $Q_{72}$ high when timing capacitor $54_a$ is selected.

Other timing capacitors $54_b$ or $54_c$ may be selected in the same manner to develop ramp signals of different sweep rates or slopes. FET $Q_{76}$ and second emitter coupled transistor pair $Q_{62}$-$Q_{63}$ are energized to select timing capacitor $54_b$. FET $Q_{71}$ and diode $D_2$ constitute part of the closed loop in this instance. Similarly, FET $Q_{77}$ and third transistor pair $Q_{64}$-$Q_{65}$ are energized to select timing capacitor $54_c$. FET $Q_{72}$ and diode $D_3$ constitute part of the closed loop in this instance. A wide range of sweep signals are generated by simply utilizing a single current source $I_T$.

The use of the independent reset current switch/disconnect diode for each timing capacitor and current steering FETs $Q_{75}$ through $Q_{77}$ is responsible for deletion of a selector switch in series with the timing capacitor from which the ramp signal is derived. This is very useful in avoiding voltage steps, spikes, etc. which cause non-linearity of the ramp signal.

Although the buffer amplifiers connected to each timing capacitor are identical in this particular embodiment, different buffer amplifiers may be better suited for each sweep signal, i.e., a faster buffer amplifier for high speed sweep signal. FIG. 8 shows a circuit schematic of such an example. Assuming that first timing capacitor $54_a$ is the lowest in capacitance for developing a high speed sweep signal, Darlington connected high frequency transistors $Q_{78}$ and $Q_{79}$ are used as buffer amplifier $56_a$ for such timing capacitor. Slight leakage current of the timing current $I_T$ may be caused because of the finite base bias current characteristic of bipolar transistors. However, such leakage or bias current may be minimized by using the Darlington connection of two high current gain transistors, increasing the timing current $I_T$, or controlling current source 80 in proportion to the $I_T$. Alternatively, very short channel high $f_{TMOS}$ FET may be substituted for the Darlington transistors.

The foregoing description is made on preferred embodiments of this invention so that one having skill in the art can put the present invention into practice in any forms best suited to a particular application. Therefore, many changes may be made in the details of the preferred embodiments of the present invention without departing from the scope of the present invention.

What we claim as being novel is:

1. A sweep generator comprising:
   a source of timing current;
   an amplifier having an input terminal and producing an output voltage in proportion to an input voltage at said input terminal, said timing current being applied to said input terminal;
   a timing capacitor connected between said input terminal and point of common reference potential;
   means for receiving a sweep gate signal;
   a source of constant reset current; and
   means coupled to said sweep gate signal receiving means for connecting said reset current source to the input of said amplifier in the absence of said sweep gate signal, said reset current source thereby absorbing said timing current, discharging said timing capacitor and reducing said amplifier output voltage to a minimum level, and for disconnecting said reset current source from the input of said amplifier in response to said sweep gate signal, said timing current thereby charging said timing capacitor to increase the amplifier output voltage in a ramp fashion.

2. A sweep generator comprising:
   a source of timing current;
   an amplifier having an input terminal and producting an output voltage in proportion to an input voltage at said input terminal, said timing current being applied to said input terminal;
   a timing capacitor connected between said input terminal and a point of common reference potential;
   means for receiving a sweep gate signal;
   a source of constant reset current;
   a source of difference current of magnitude inversely proportional to an excess of said amplifier output voltage over an applied reference voltage, said difference current being applied to said input terminal of said amplifier; and
   means coupled to said sweep gate signal receiving means for connecting said reset current source to the input of said amplifier in the absence of said sweep gate signal, said reset current source thereby discharging said timing capacitor and reducing said amplifier output voltage to a level wherein said difference current and said timing current in sum are matched and absorbed by said reset current source to maintain said amplifier voltage at a minimum voltage proportional to said reference voltage, and for disconnecting said reset current source from the input of said amplifier in response to said sweep gate signal, said timing current thereby charging said timing capacitor to increase the amplifier output voltage at a rate proportional to said timing current.

3. A programmable sweep generator comprising:
   a source of timing current;
   a plurality of amplifiers, each having an input terminal and producing an output voltage in proportion to an input voltage at said input terminal;
   a plurality of timing capacitors, each being connected between the input terminal of a separate one of said amplifiers and point of common reference potential;

first switch means for connecting said timing current source to the input terminal of any one selected amplifier;

means for receiving a sweep gate signal;

a source of constant reset current, said reset current being larger than said timing current; and second switch means coupled to said sweep gate signal receiving means for connecting said reset current source to the input of said selected amplifier in the absence of said sweep gate signal, said reset current source absorbing said timing current, discharging said timing capacitor and reducing said selected amplifier output voltage to a minimum level, and for disconnecting said timing current source from the input of said selected amplifier in response to said sweep gate signal, such that said timing current charges said timing capacitor of said selected amplifier, thereby increasing the output voltage of said selected amplifier.

4. A programmable sweep generator comprising:

an integrator having an input terminal and an output terminal for producing an output voltage which increases at a rate proportional to a timing current applied to said input terminal;

means for producing a variable control voltage;

a plurality of current sources connected to said variable control voltage producing means;

a source of digital control signals comprising complementary first and second digital signals, one of said digital control signals corresponding to each of said current sources; and a plurality of switch means, one corresponding to each of said current sources, for selectively connecting the corresponding current source to said integrator input terminal in response to the corresponding digital control signal, thereby producing said timing current as a sum of current generated by all said connected current sources, wherein each said switch means comprises:

a first transistor having a collector connected to said integrator input, a base for receiving said first digital signal of said corresponding digital control signal, and an emitter; and a second transistor having a collector connected to a point of common reference potential, a base for receiving said second digital signal of said corresponding digital control signal, and an emitter connected to the emitter of said first transistor and to the corresponding current source, said corresponding current source being connected to said integrator input through the emitter and collector of said first transistor when said digital control signal is of a first state, and connected to said point of common reference potential through the emitter and collector of said second transistor when said digital control signal is of a second state.

5. A sweep generator as in claim 4 wherein each said current source generates a current of a magnitude which varies according to said variable control voltage.

6. A sweep generator as in claim 4 wherein each said current source comprises:

a voltage source;

a resistor; and a third transistor having a collector, an emitter, and a base, said emitter being coupled to said voltage source through said resistor and producing a collector current output proportional to a variable control voltage applied to said third transistor base.

7. A sweep generator as in claim 4 wherein said integrator comprises:

an amplifier for producing an output voltage in proportion to an input voltage at said input terminal;

a timing capacitor connected between said input terminal and a point of common reference potential;

means for receiving a sweep gate signal;

a source of constant reset current; and means coupled to said sweep gate signal receiving means for connecting said reset current source to the input of said amplifier in the absence of said sweep gate signal, said reset current source thereby absorbing said timing current, discharging ssaid timing capacitor, and reducing said amplifier output to a minimum level, and for disconnecting said reset current source from the input of said amplifier in response to a sweep gate signal, said timing current thereby charging said timing capacitor to increase the amplifier output voltage in a ramp fashion.

8. A sweep generator as in claim 4 wherein said integrator comprises:

an amplifier having an input terminal and producing an output voltage in proportion to an input voltage at said input terminal, said timing current being applied to said input terminal;

a timing capacitor connected between said input terminal and ground;

a source of difference current, applied to said input terminal, of magnitude inversely proportional to an excess of amplifier output voltage over a reference voltage;

means for receiving a sweep gate signal;

a source of constant reset current; and means coupled to said sweep gate signal receiving means for connecting said reset current source to the input of said amplifier in the absence of said sweep gate signal, said reset current source thereby discharging said timing capacitor to reduce said amplifier output to a minimum level wherein said difference current and said timing current are absorbed by said reset current source, and for disconnecting said timing current from the input of said amplifier in response to said sweep gate signal, said timing current thereby charging said timing capacitor to increase the amplifier output voltage in a ramp fashion.

9. A sweep generator as in claim 8 wherein each said current source provides a current of variable magnitude according to an applied variable control voltage.

* * * * *